(12) United States Patent
Hojo

(10) Patent No.: US 6,429,745 B1
(45) Date of Patent: Aug. 6, 2002

(54) SEMICONDUCTOR DEVICE

(75) Inventor: Yoshiyuki Hojo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/984,796

(22) Filed: Oct. 31, 2001

(30) Foreign Application Priority Data

Nov. 15, 2000 (JP) ...................................... 2000-348306

(51) Int. Cl.$^7$ ................................................ H03F 1/14
(52) U.S. Cl. ......................... 330/292; 330/67; 330/307
(58) Field of Search ............... 330/65, 67, 292, 330/305, 307

(56) References Cited

U.S. PATENT DOCUMENTS

| | | | | |
|---|---|---|---|---|
| 4,048,590 A | * | 9/1977 | Dobberpuhl | ............ 331/116 R |
| 5,939,944 A | * | 8/1999 | Gibson | ........................ 330/255 |
| 6,316,983 B1 | * | 11/2001 | Kitamura | ..................... 327/317 |
| 6,344,775 B1 | * | 2/2002 | Morizuka et al. | ........... 330/288 |

* cited by examiner

Primary Examiner—Robert Pascal
Assistant Examiner—Henry Choe
(74) Attorney, Agent, or Firm—Rader, Fishman & Grauer PLLC

(57) ABSTRACT

In conventional cases, when connecting a capacitor having a low equivalent series resistance (ESR) to an output terminal of a semiconductor device as a phase compensation capacitor, an external resistor connected in series therewith is required. A semiconductor device of the present invention comprises a resistor that is formed within the semiconductor device and of which one end is connected to the output terminal for compensating for a low ESR component, and a capacitor connection terminal to which another end of the resistor is connected. The resistor thus arranged compensates for the low ESR component of a low-ESR capacitor that is connected externally to the capacitor connection terminal.

6 Claims, 2 Drawing Sheets

SEMICONDUCTOR DEVICE

BACKGROUND OF THE INVENTION

1. Field of the Invention

The present invention relates to a semiconductor device for use as an amplifier, a regulator, or the like that requires a phase compensation capacitor to be connected to an output terminal arranged thereof.

2. Description of the Prior Art

Among conventional semiconductor devices requiring a phase compensation capacitor to be connected to an output terminal thereof, a power IC (Integrated Circuit) is taken as an example and described hereinafter. FIGS. 3 and 4 are circuit diagrams showing the outline of a conventional power IC. A power IC 10" as shown in FIG. 3 is a semiconductor device that sends out signals output from a driver circuit 11 to a load Z1 via an output terminal T1. The driver circuit 11 comprises, for example, multiple amplifying stages (not illustrated).

At the same time, a phase compensation capacitor C1 is connected to the output terminal T1 externally in parallel with the load Z1. This phase compensation capacitor C1 is connected in order to suppress abnormal oscillations occurring in the driver circuit 11 and serves to form a pole at a lower frequency where a phase lag in output signals occurs so as to maintain a loop gain below 1 at a zero (phase=0) which is found in an input-output phase characteristic. This arrangement eventually serves to compensate the phase by decreasing the gain at a higher frequency side.

In the conventional cases, electrolytic capacitors or tantalum capacitors having a capacitance of approximately 10 $\mu$F are often used as a phase compensation capacitor. However, since these electrolytic capacitors have a polarity, an accidental connection to an opposite pole when mounting the capacitor induces problems that cause the capacitor to emit smoke or break down. Recently, because of these drawbacks, nonpolarized capacitors, particularly ceramic capacitors, have been used preferably as a phase compensation capacitor instead.

However, the aforementioned ceramic capacitors have a lower equivalent series resistance (ESR) component when compared to the electrolytic or tantalum capacitors. Different from other commonly used capacitors having a low ESR component, the ceramic capacitors display a peculiar phase characteristic in which an inherently low ESR component is further decreased at a specific frequency.

As mentioned above, when a low-ESR capacitor having an extremely low ESR component is used as the phase compensation capacitor C1 as is, the phase characteristic of the driver circuit 11 is influenced, thereby creating the zero in terms of phase characteristic at a higher frequency side. As a result, the loop gain is increased thereat so that the driver circuit 11 becomes unstable, making it prone to oscillate, The frequency at which the aforementioned zero occurs is given by $$f = \frac{1}{2\pi \times Co \times ESR}$$

In the above equation, it is assumed that capacitance of the phase compensation capacitor C1 is Co and the equivalent series resistance component thereof is ESR.

As calculated from the equation, the frequency at which the zero occurs moves to a lower frequency side if a larger ESR value is given to the phase compensation capacitor C1. Consequently, a wider phase margin becomes available by which a possibility of oscillation is decreased.

Therefore, when a capacitor such as a ceramic capacitor having a low ESR component is used as the phase compensation capacitor C1, it is necessary to place an external resistor R1 in series so as to compensate for the low ESR component of the capacitor.

As mentioned above, if a low-ESR capacitor (a capacitor having a low ESR component) such as a ceramic capacitor having no polarity is used as the phase compensation capacitor C1 and is connected to the output terminal T1, there is no worry over a reverse connection that leads the capacitor to cause problems such as emitting smoke, thereby lowering the occurrence of troubles when mounting components and enabling a smooth flow of the capacitor mounting process.

On the other hand, a low-ESR capacitor for use as the phase compensation capacitor C1 requires the additional external resistance R1 which is not necessary if an electrolytic capacitor or the like is used instead. This requirement causes such problems to be solved as an increase in the number of components to be used, a decrease in reliability because of increased connection points, an increase in mounting area, an increase in cost, and the like.

SUMMARY OF THE INVENTION

An object of the present invention is, in light of the problems caused by conventional devices, to provide a semiconductor device that offers advantages such as a smaller mounting area even if a low-ESR capacitor is used as a phase compensation capacitor.

To achieve the above object, according to one aspect of the present invention, a semiconductor device requiring a phase compensation capacitor to be connected externally to the output terminal has an output transistor and an output terminal to which the output transistor is connected, wherein, to permit a low-ESR capacitor having a low equivalent series resistance component to be used as the phase compensation capacitor, the semiconductor device further comprises: a resistor of which one end is connected to a node between the output transistor and the output terminal; and a capacitor connection terminal to which another end of the resistor is connected, so that, when the low-ESR capacitor is connected externally to the capacitor connection terminal, the low equivalent series resistance component thereof is compensated for by the resistor.

According to another aspect of the present invention, a semiconductor device requiring a phase compensation capacitor to be connected externally to the output terminal has an output transistor and an output terminal to which the output transistor is connected, wherein, to permit a low-ESR capacitor having a low equivalent series resistance component to be used as the phase compensation capacitor, the semiconductor device further comprises: a resistor of which one end is connected to ground; and a capacitor connection terminal to which another end of the resistor is connected, so that, when the low-ESR capacitor is connected externally between the output terminal and the capacitor connection terminal, the low equivalent series resistance component thereof is compensated for by the resistor.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
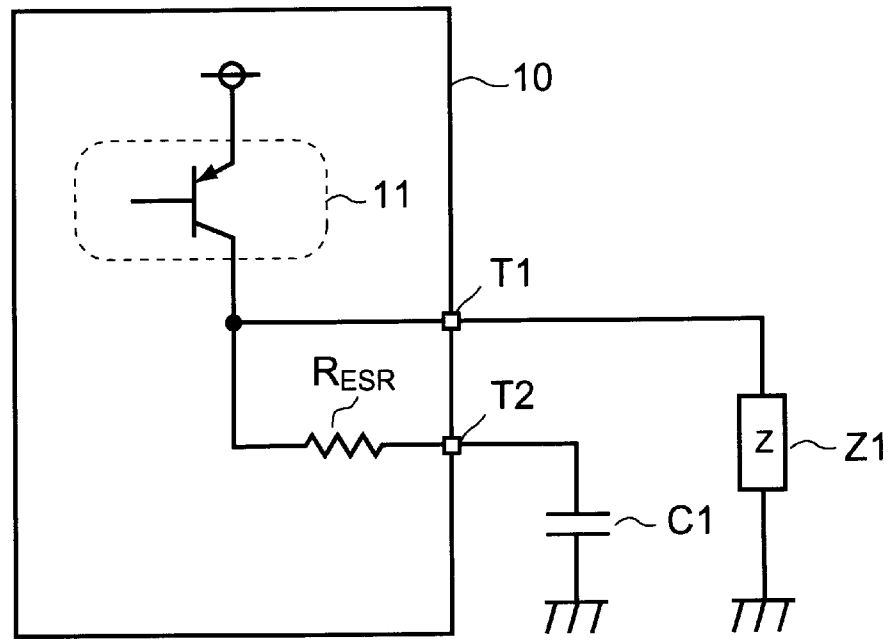
FIG. 1 is a circuit diagram showing a power IC of a first embodiment of the invention.
Figure 3:
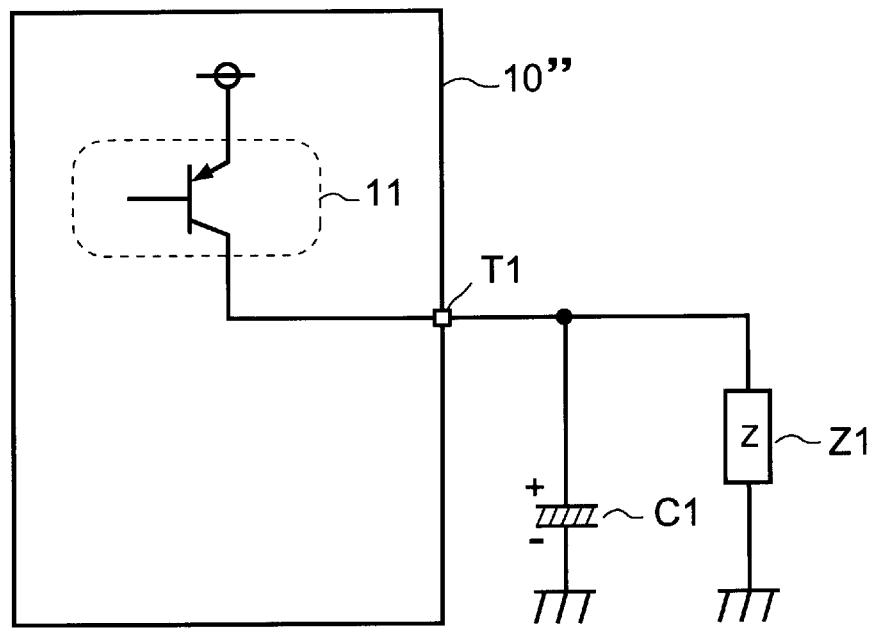
FIG. 3 is a circuit diagram showing the outline of a conventional power IC.
Figure 4:
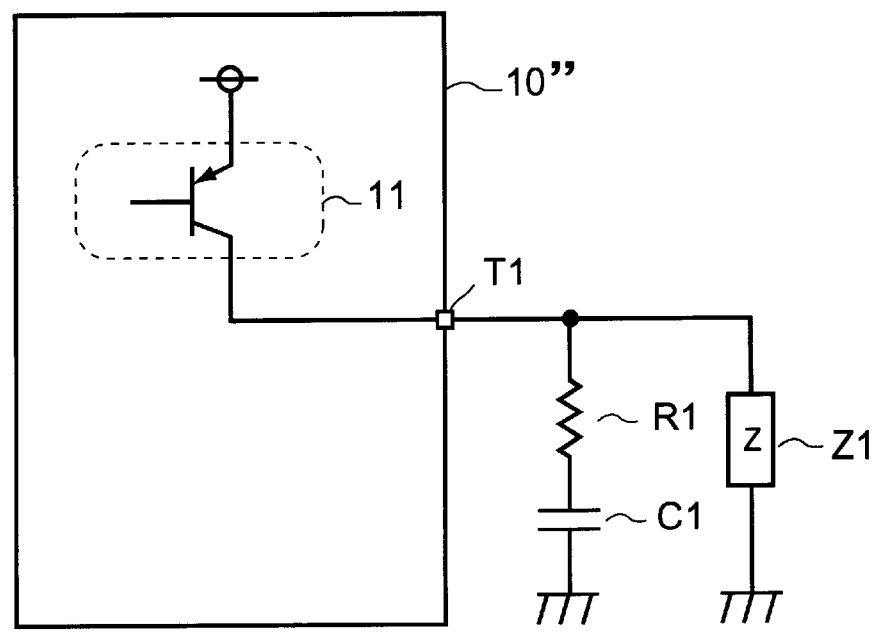
FIG. 4 is a circuit diagram showing another outline of a conventional power IC.

Hereinafter, embodiments of the present invention will be described with reference to the accompanying drawings, taking a power IC as an example of the present invention. FIG. 1 is a circuit diagram showing the power IC of a first embodiment of the invention. Such identical components as are found also in FIGS. 3 and 4 are identified with the same reference numerals, and overlapping descriptions will not be repeated. The following descriptions deal with the present invention focusing on new items.

As shown in FIG. 1, inside a power IC 10 of the present invention is formed a resistor $R_{ESR}$ of which one end is connected to a node between an output terminal T1 and a collector of an output transistor that is formed as a driver circuit 11. The resistor $R_{ESR}$ is connected at another end to an capacitor connection terminal T2 that is arranged for connecting a capacitor separately from the output terminal T1. A phase compensation capacitor C1 is connected between the capacitor connection terminal T2 and ground.

As described above, the power IC comprises the capacitor connection terminal T2 that is arranged separately from the output terminal T1 and the resistor $R_{ESR}$ formed and connected internally so as to compensate for a low ESR component even if a phase compensation capacitor having a low ESR component is used as the phase compensation capacitor C1, thereby eliminating a necessity to connect externally the resistor R1 as shown in FIG. 4 for compensating for the ESR component. As a result, with the power IC 10 mounted in a set, it helps realize a miniaturization of the set and a reduction in cost.

Furthermore, because this structure enables a usage of a low-ESR ceramic capacitor having no polarity as the phase compensation capacitor C1, such problems as emitting smoke that are caused when mounting an electrolytic or tantalum capacitor in reverse direction are overcome, thereby enhancing the reliability. In addition, because said ceramic capacitors take up smaller mounting space when used as the phase compensation capacitor C1, a set employing the ceramic capacitors is made smaller when compared with a set employing the electrolytic or tantalum capacitors.

Figure 2:
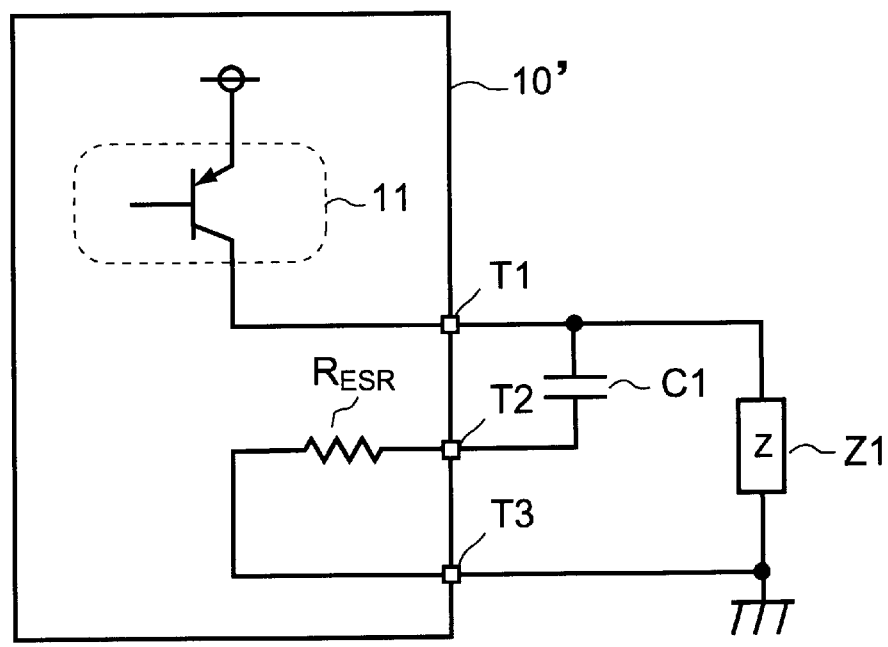
FIG. 2 is a circuit diagram showing a power IC of a second embodiment of the invention.

A power IC of a second embodiment of the present invention will be described hereinafter. FIG. 2 is a circuit diagram showing the power IC of the second embodiment. A structure of a power IC 10' of the second embodiment is almost identical with the power IC 10 of the first embodiment described earlier (FIG. 1). Therefore, such similar components in structure and function as are found also in FIG. 1 are identified with the same reference numerals, and overlapping descriptions will not be repeated. The following descriptions deal with the second embodiment focusing on new items.

As shown in FIG. 1, inside a power IC 10' of the present invention is formed a resistor $R_{ESR}$, of which one end is connected to a ground terminal T3. The resistor $R_{ESR}$ is connected at another end to an capacitor connection terminal T2 that is arranged separately from an output terminal T1. A phase compensation capacitor C1 is connected between the output terminal T1 and the capacitor connection terminal T2. This structure also serves to provide a similar result as obtained through the first embodiment described earlier.

If a low-ESR ceramic capacitor or the like having a capacitance of approximately 10 $\mu$F is used as the phase compensation capacitor C1 in the case of the power IC 10 of the first embodiment or the power IC 10' of the second embodiment, an ESR component to be added by the resistor $R_{ESR}$ will be an extremely small amount ranging from a few scores of milliohms to a few ohms. Because of this amount, it is possible to arrange an effective resistor $R_{ESR}$ without actually forming a piece of resistor in the power IC 10 or 10'.

This is achieved by effectively using resistance found in wiring, for example, by adjusting length or width of an internal conductor which is made of aluminum, polysilicon, or the like and which runs from the output terminal T1 to the capacitor connection terminal T2 in the case of the first embodiment or which runs from the capacitor connection terminal T2 to a ground terminal T3 in the case of the second embodiment. It is also possible to adjust length or width of a bonding wire used internally for achieving the same result.

When an electrolytic capacitor having a sufficiently large ESR component is used as a phase compensation capacitor C1, it is possible to directly connect the electrolytic capacitor between the output terminal T1 and ground as in the conventional case. A similar result is also achieved by connecting the electrolytic capacitor between the capacitor connection terminal T2 and ground while the output terminal T1 and the capacitor connection terminal T2 are being short-circuited. As described before, the power ICs 10 and 10' of the first and second embodiments accept a wide range of capacitor for use as a phase compensation capacitor regardless of the ESR component thereof, thereby enhancing the flexibility and providing the excellent usability.

It is to be understood that, although the first and second embodiments deal with a power IC as an example, the present invention is not limited to the power IC and is applicable to a wide range of semiconductor devices that require a phase compensation capacitor to be connected to an output terminal thereof.

As described before, according to one aspect of the present invention, a semiconductor device requiring a phase compensation capacitor to be connected externally to the output terminal has an output transistor and an output terminal to which the output transistor is connected, wherein, to permit a low-ESR capacitor having a low equivalent series resistance component to be used as the phase compensation capacitor, the semiconductor device further comprises: a resistor of which one end is connected to a node between the output transistor and the output terminal; and a capacitor connection terminal to which another end of the resistor is connected, so that, when the low-ESR capacitor is connected externally to the capacitor connection terminal, the low equivalent series resistance component thereof is compensated for by the resistor.

According to another aspect of the present invention, a semiconductor device requiring a phase compensation capacitor to be connected externally to the output terminal has an output transistor and an output terminal to which the output transistor is connected, wherein, to permit a low-ESR capacitor having a low equivalent series resistance component to be used as the phase compensation capacitor, the semiconductor device further comprises: a resistor of which one end is connected to ground; and a capacitor connection terminal to which another end of the resistor is connected, so that, when the low-ESR capacitor is connected externally between the output terminal and the capacitor connection terminal, the low equivalent series resistance component thereof is compensated for by the resistor.

In the above-described structures, a resistor for compensating for the low ESR component is not required to be connected externally as in the conventional case even if a low-ESR capacitor is used as a phase compensation capacitor. As a result, it is possible to realize a miniaturization of a set equipped with the semiconductor device of the present invention and a reduction in cost thereof.

Moreover, as a ceramic capacitor (no polarity) having a low ESR component is made available for use as a phase compensation capacitor, such problems as emitting smoke that are caused when an electrolytic capacitor having polarity is connected in reverse direction are overcome, thereby enhancing the reliability. In addition to these advantages, as the ceramic capacitor requires a smaller area to install than the electrolytic capacitor, a set equipped with the ceramic capacitors can be made smaller than a set equipped with the electrolytic capacitors. Furthermore, a semiconductor device of the present invention accepts a wide range of capacitors as a phase compensation capacitor regardless of the ESR component thereof, thereby enhancing the flexibility and providing the excellent usability.

What is claimed is:

1. A semiconductor device having an output transistor and an output terminal to which the output transistor is connected, the semiconductor device requiring a phase compensation capacitor to be connected externally to the output terminal, wherein, to permit a low-ESR capacitor having a low equivalent series resistance component to be used as the phase compensation capacitor, the semiconductor device further comprises:

a resistor of which one end is connected to a node between the output transistor and the output terminal; and a capacitor connection terminal to which another end of the resistor is connected, so that, when the low-ESR capacitor is connected externally to the capacitor connection terminal, the low equivalent series resistance component thereof is compensated for by the resistor.

2. A semiconductor device as claimed in claim 1, wherein the resistor is formed by way of adjusting length or width of a conductor or a bonding wire that is arranged within the semiconductor device.

3. A semiconductor device as claimed in claim 1, wherein the low-ESR capacitor is a ceramic capacitor.

4. A semiconductor device having an output transistor and an output terminal to which the output transistor is connected, the semiconductor device requiring a phase compensation capacitor to be connected externally to the output terminal, wherein, to permit a low-ESR capacitor having a low equivalent series resistance component to be used as the phase compensation capacitor, the semiconductor device further comprises:

a resistor of which one end is connected to ground; and a capacitor connection terminal to which another end of the resistor is connected, so that, when the low-ESR capacitor is connected externally between the output terminal and the capacitor connection terminal, the low equivalent series resistance component thereof is compensated for by the resistor.

5. A semiconductor device as claimed in claim 4, wherein the resistor is formed by way of adjusting length or width of a conductor or a bonding wire that is arranged within the semiconductor device.

6. A semiconductor device as claimed in claim 4, wherein the low-ESR capacitor is a ceramic capacitor.

* * * * *